(12) United States Patent
Lu et al.

(10) Patent No.: US 10,283,614 B1
(45) Date of Patent: May 7, 2019

(54) SEMICONDUCTOR STRUCTURE INCLUDING HIGH ELECTRON MOBILITY TRANSISTOR DEVICE

(71) Applicant: United Microelectronics Corp., Hsinchu (TW)

(72) Inventors: Ming-Chang Lu, Changhua County (TW); Wei Chen, Tainan (TW)

(73) Assignee: United Microelectronics Corp., Hsinchu (TW)

(*) Notice: Subject to any disclaimer, the term of this patent is extended or adjusted under 35 U.S.C. 154(b) by 12 days.

(21) Appl. No.: 15/886,724

(22) Filed: Feb. 1, 2018

(51) Int. Cl.
| | | |
|---|---|---|
| H01L 29/66 | (2006.01) | |
| H01L 29/10 | (2006.01) | |
| H01L 29/20 | (2006.01) | |
| H01L 29/267 | (2006.01) | |
| H01L 21/02 | (2006.01) | |
| H01L 29/43 | (2006.01) | |
| H01L 29/778 | (2006.01) | |
| H01L 29/417 | (2006.01) | |

(52) U.S. Cl.
CPC .. *H01L 29/66462* (2013.01); *H01L 21/02271* (2013.01); *H01L 29/1066* (2013.01); *H01L 29/2003* (2013.01); *H01L 29/267* (2013.01); *H01L 29/41766* (2013.01); *H01L 29/432* (2013.01); *H01L 29/7784* (2013.01); *H01L 29/7787* (2013.01)

(58) Field of Classification Search
CPC ........... H01L 29/66431; H01L 29/7783; H01L 2924/13064; H01L 29/66462; H01L 29/778–29/7789; H01L 29/122–29/127; H01L 29/15–29/158; H01L 29/267; H01L 29/20; H01L 29/2003
See application file for complete search history.

(56) References Cited

U.S. PATENT DOCUMENTS

| | | | |
|---|---|---|---|
| 9,368,610 B2 | 6/2016 | Chiang et al. | |
| 9,379,191 B2 | 6/2016 | Hsu et al. | |
| 2015/0108472 A1* | 4/2015 | Suzawa | H01L 29/78648 257/43 |
| 2017/0170211 A1* | 6/2017 | Yamazaki | H01L 27/1225 |

* cited by examiner

*Primary Examiner* — Thanh Y. Tran
(74) *Attorney, Agent, or Firm* — J.C. Patents

(57) ABSTRACT

Provided is a semiconductor structure including a substrate, a first semiconductor layer, a second semiconductor layer, a gate electrode, a source electrode and a drain electrode. The first semiconductor layer contains a group III-V-VI semiconductor compound layer and is disposed on the substrate. The second semiconductor layer includes a group III-V semiconductor compound and is disposed on the first semiconductor layer. The gate electrode is disposed on the second semiconductor layer. The source electrode and the drain electrode are disposed on the second semiconductor layer beside the gate electrode.

18 Claims, 5 Drawing Sheets

SEMICONDUCTOR STRUCTURE INCLUDING HIGH ELECTRON MOBILITY TRANSISTOR DEVICE

BACKGROUND OF THE INVENTION

Field of Invention

The present invention is related to a semiconductor structure, and more generally to a semiconductor structure including a high electron mobility transistor (HEMT) device.

Description of Related Art

In the semiconductor field, due to their characteristics, group III-V semiconductor compounds are used to form various integrated circuit devices, such as high power field-effect transistor devices, high frequency transistor devices or HEMT devices.

HEMT devices are able to operate at higher frequencies than ordinary transistors, up to millimeter wave frequencies, and are used in high-frequency products such as cell phones, satellite television receivers, voltage converters, and radar equipment. HEMT devices may be normally-on or normally off depends on the design requirements. HEMT devices formed from gallium nitride (GaN) material systems are known and popular in the industry. However, lattice mismatch between silicon and GaN has been an issue for many years.

SUMMARY OF THE INVENTION

Accordingly, the present invention provides a semiconductor structure, in which a group III-V-VI semiconductor compound material is provided to effectively mitigate lattice mismatch between the group III-V semiconductor compound and the silicon-based substrate.

The present invention provides a semiconductor structure including a substrate, a first semiconductor layer, a second semiconductor layer, a gate electrode, a source electrode and a drain electrode. The first semiconductor layer contains a group III-V-VI semiconductor compound layer and is disposed on the substrate. The second semiconductor layer includes a group III-V semiconductor compound and is disposed on the first semiconductor layer. The gate electrode is disposed on the second semiconductor layer. The source electrode and the drain electrode are disposed on the second semiconductor layer beside the gate electrode.

According to an embodiment of the present invention, the first semiconductor layer includes GaNO, AlGaNO, AlNO, GaNS, GaNOS or a combination thereof.

According to an embodiment of the present invention, a group VI element content in the group III-V-VI semiconductor compound layer of the first semiconductor layer is substantially constant.

According to an embodiment of the present invention, a group VI element content in the group III-V-VI semiconductor compound layer of the first semiconductor layer is varied.

According to an embodiment of the present invention, an oxide content in a lower portion of the first semiconductor layer is higher than an oxide content in an upper portion of the first semiconductor layer.

According to an embodiment of the present invention, the first semiconductor layer further contains a group III-V semiconductor compound layer over the group III-V-VI semiconductor compound layer.

According to an embodiment of the present invention, the group III-V semiconductor compound layer of the first semiconductor layer includes GaN.

According to an embodiment of the present invention, the semiconductor structure further includes a nucleation layer between the substrate and the first semiconductor layer.

According to an embodiment of the present invention, the nucleation layer contains a group III-V semiconductor compound.

According to an embodiment of the present invention, the nucleation layer includes GaN, AlN, AlGaN, AlInN, InGaN, InAlGaN or a combination thereof.

According to an embodiment of the present invention, the nucleation layer contains a group III-V-VI semiconductor compound.

According to an embodiment of the present invention, the nucleation layer includes GaNO, AlGaNO, AlNO GaNS, GaNOS or a combination thereof.

According to an embodiment of the present invention, the second semiconductor layer includes AlN, AlGaN, AlInN, InAlGaN or a combination thereof.

According to an embodiment of the present invention, the substrate includes silicon, silicon carbide (SiC), silicon germanium (SiGe) or a combination thereof.

According to an embodiment of the present invention, the semiconductor structure is a normally-on HEMT device.

According to an embodiment of the present invention, the semiconductor structure is a normally-off HEMT device.

In view of the above, in the present invention, a group III-V-VI semiconductor compound material is provided between silicon and GaN, so as to reduce lattice dislocation resulting from lattice mismatch between silicon and GaN, and therefore improve the performance of the device.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
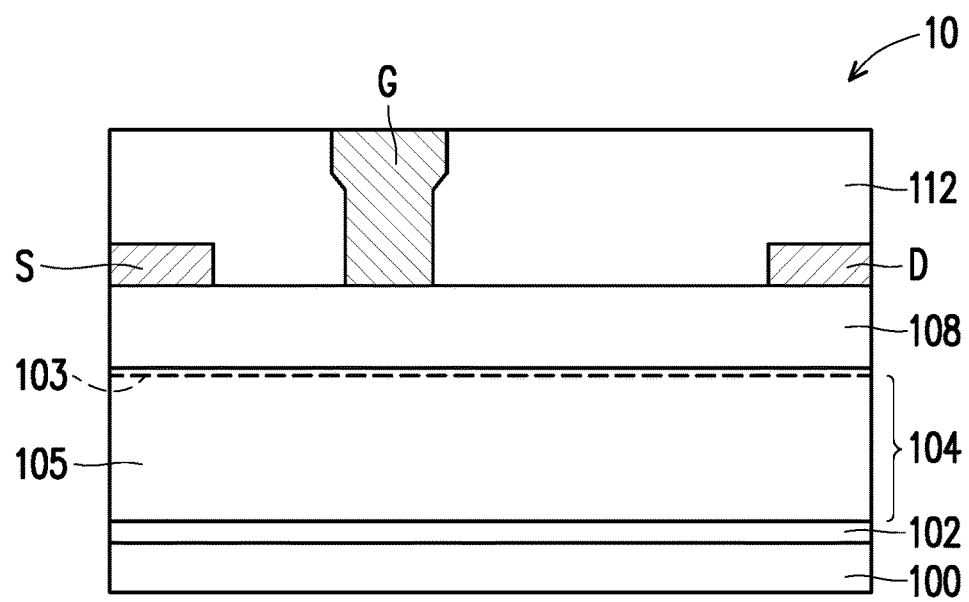
FIG. 1 to FIG. 9 are schematic cross-sectional views of semiconductor structures in accordance with some embodiments of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic cross-sectional view of a semiconductor structure in accordance with an embodiment of the present invention.

Referring to FIG. 1, a semiconductor structure 10 includes a substrate 100, a first semiconductor layer 104, a second semiconductor layer 108, a gate electrode G, a source electrode S and a drain electrode D.

The substrate 100 may be formed from any semiconductor material suitable for manufacturing a semiconductor structure. In an embodiment, the substrate 100 includes a material suitable for the epitaxial growth of a group III-V semiconductor compound and/or a group III-V-VI semiconductor compound. In an embodiment, the substrate 100 includes a group IV compound, such as silicon, silicon carbide (SiC), silicon germanium (SiGe) or a combination thereof. For example, the substrate 100 is formed from silicon. In another embodiment, the substrate 100 may be a composite substrate including a lower silicon-free substrate and an upper silicon-containing substrate. The lower silicon-free substrate may include sapphire, and the upper silicon-based substrate may be a silicon substrate.

The first semiconductor layer 104 contains a group III-V-VI semiconductor compound layer 105 and is disposed on the substrate 100. Herein, the group III-V-VI semiconductor compound indicates a compound including at least one group III element, at least one group V element and at least one group VI element of the periodic table, and these elements are chemically bonded (rather than physically mixed) with each other. In an embodiment, the first semiconductor layer 104 or the group III-V-VI semiconductor compound layer 105 includes GaNO, AlGaNO, AlNO, GaNS, GaNOS or a combination thereof. For example, the first semiconductor layer 104 or the group III-V-VI semiconductor compound layer 105 is formed from GaNO. The first semiconductor layer 104 or the group III-V-VI semiconductor compound layer 105 may be doped or undoped. In an embodiment, the first semiconductor layer 104 serves a buffer layer that reduces the density of dislocations due to mismatch between the substrate 100 and the overlying GaN layer. In another embodiment, the first semiconductor layer 104 serves a channel layer in which a 2-dimensional electron gas (2DEG) is formed. For example, as shown in FIG. 1, the first semiconductor layer 104 has a 2-dimensional electron gas (2DEG) layer 103 located below the interface of the first semiconductor layer 104 and the overlying second semiconductor layer 108.

It is noted that, as compared to the conventional group III-V semiconductor compound, the group III-V-VI semiconductor compound of the present invention provides a lattice constant closer to that of the group V substrate, and thus, the lattice dislocation is eliminated and a 2DEG mobility is accordingly improved.

In an embodiment, a nucleation layer 102 is further provided between the substrate 100 and the first semiconductor layer 104. The nucleation layer 102 is configured to reduce a difference in lattice substantially constant and/or a difference in thermal expansion coefficient between the substrate 100 and the first semiconductor layer 104.

In an embodiment, the nucleation layer 102 contains a group III-V semiconductor compound. Herein, the group III-V semiconductor compound indicates a compound including at least one group III element and at least one group V element of the periodic table, and these elements are chemically bonded (rather than physically mixed) with each other. In an embodiment, the nucleation layer 102 includes GaN, AlN, AlGaN, AlInN, InGaN, InAlGaN or a combination thereof.

In another embodiment, the nucleation layer 102 contains a group III-V-VI semiconductor compound. In an embodiment, the nucleation layer 102 includes GaNO, AlGaNO, AlNO GaNS, GaNOS or a combination thereof. In an embodiment, the group III-V-VI semiconductor compound included in the nucleation layer 102 is different from the group III-V-VI semiconductor compound included in the first semiconductor layer 104. Specifically, the nucleation layer 102 serves a lattice transition layer between the substrate 100 and the first semiconductor layer 104.

The second semiconductor layer 108 includes a group III-V semiconductor compound and is disposed on the first semiconductor layer 104. In an embodiment, the second semiconductor layer 108 includes AlN, AlGaN, AlInN, InAlGaN or a combination thereof. The second semiconductor layer 108 may be doped or undoped. In an embodiment, the second semiconductor layer 108 is a single layer. In another embodiment, the second semiconductor layer 108 has a multi-layer structure. In an embodiment, the second semiconductor layer 108 serves as a barrier layer that prevents diffusion of metal atoms into the underlying first semiconductor layer 104. In an embodiment, the second semiconductor layer 108 serves as a donor (carrier supply) layer that supplies electrons to the 2DEG layer 103. In an embodiment, the second semiconductor layer 108 has a larger bandgap than the first semiconductor layer 104.

The gate electrode G is disposed on the second semiconductor layer 108. In an embodiment, the gate electrode G includes metal or a metal nitride, such as Ta, TaN, Ti, TiN, TiW W, WN, TiWN, Pd, Ni, Au, Al, or a combination thereof. The gate electrode G may include a material able to form a Schottky contact with a group III-V semiconductor compound.

The source electrode S and the drain electrode D are disposed on the second semiconductor layer 108 beside the gate electrode G. In an embodiment, the source electrode S and the drain electrode D include metal, such as Al, Ti, Ni, Au, or an alloy thereof. The source electrode S and the drain electrode D may include a material able to form an Ohmic contact with a group III-V semiconductor compound.

In an embodiment, a passivation layer 112 is further included in the semiconductor structure 10, and the passivation layer 112 is disposed aside the gate electrode G, the source electrode S and the drain electrode D. Specifically, the passivation layer 112 covers the sidewalls and tops of the source electrode S and the drain electrode D, and surrounds the sidewall the gate electrode G. In an embodiment, the passivation layer 112 includes silicon nitride.

Some possible modifications of the semiconductor structure 1 are illustrated below with reference to FIG. 2 to FIG. 8.

Figure 2:
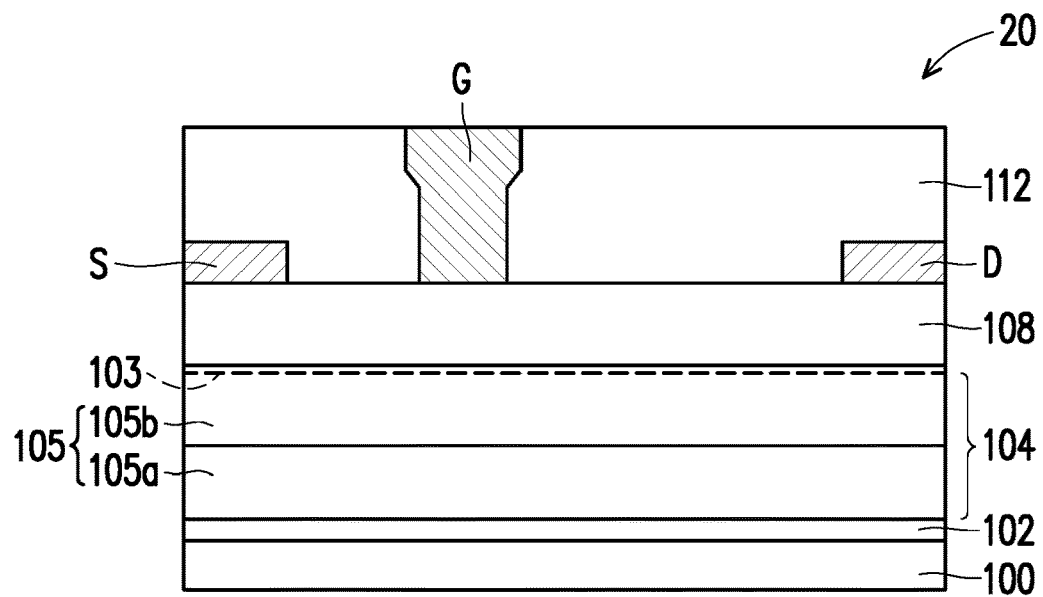

The semiconductor structure 20 of FIG. 2 is similar to the semiconductor structure 10 of FIG. 1, and the difference between them lies in that, in the semiconductor structure 20, the group VI element content in the group III-V-VI semiconductor compound layer 105 of the first semiconductor layer 104 is varied or gradient, while in the semiconductor structure 1, the group VI element content in the group III-V-VI semiconductor compound layer 105 of the first semiconductor layer 104 is substantially constant. Specifically, as shown in FIG. 2, the group III-V-VI semiconductor compound layer 105 includes a lower group III-V-VI semiconductor compound layer 105a and an upper group III-V-VI semiconductor compound layer 105b, and the oxide content in the lower group III-V-VI semiconductor compound layer 105a is higher than the oxide content in the upper group III-V-VI semiconductor compound layer 105b of the group III-V-VI semiconductor compound layer 105.

The embodiment of FIG. 2 in which the group III-V-VI semiconductor compound layer 105 has a double-layer structure is provided for illustration purposes, and is not construed as limiting the present invention. In another embodiment, the group III-V-VI semiconductor compound layer 105 may have a three-layer structure or a multi-layer structure upon the design requirements, and the group VI element content in the group III-V-VI semiconductor compound layer 105 is gradually reduced away from the substrate 100.

Figure 3:
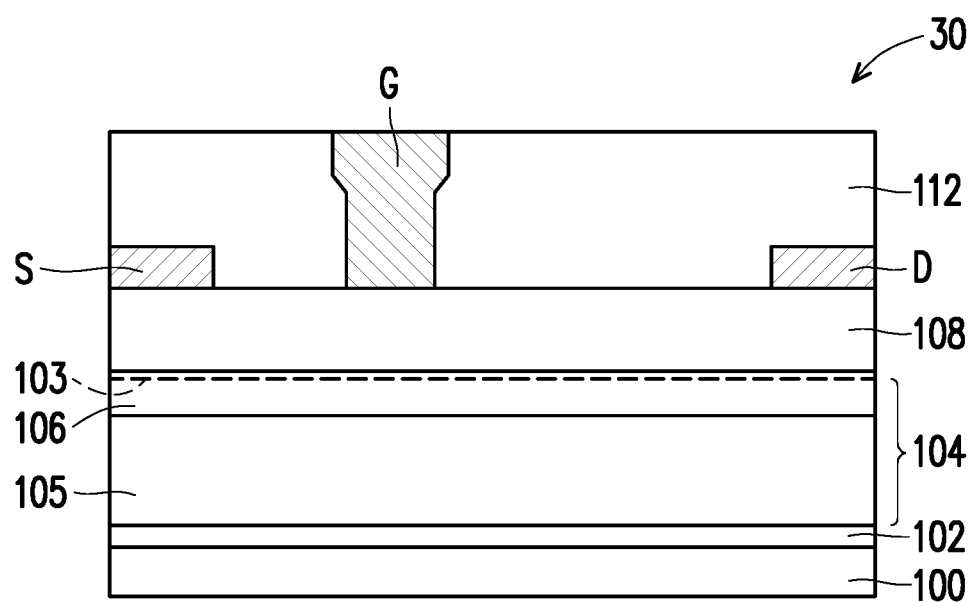

The semiconductor structure 30 of FIG. 3 is similar to the semiconductor structure 10 of FIG. 1, and the difference between them lies in that, the first semiconductor layer 104 in FIG. 3 further contains a group III-V semiconductor compound layer 106 over the group III-V-VI semiconductor compound layer 105. Specifically, the group III-V semiconductor compound layer 106 is disposed between the group III-V-VI semiconductor compound layer 105 and the second semiconductor layer 108. In an embodiment, the group III-V semiconductor compound layer 106 of the first semiconductor layer 104 includes GaN. In an embodiment, the 2DEG layer 103 is formed in the group III-V semiconductor compound layer 106 below the interface between the group III-V semiconductor compound layer 106 and the second semiconductor layer 108.

Figure 4:
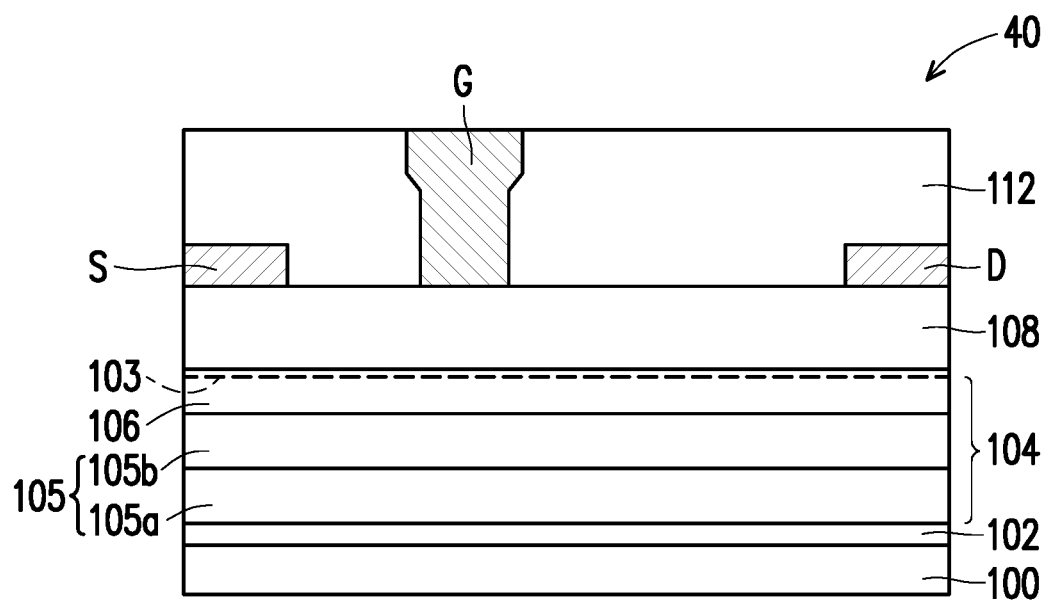
Figure 5:
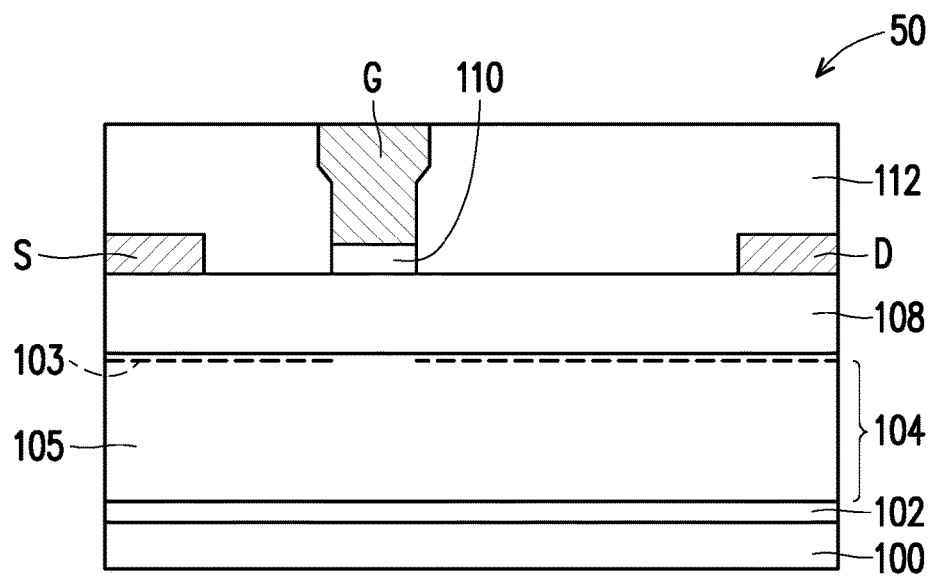
Figure 6:
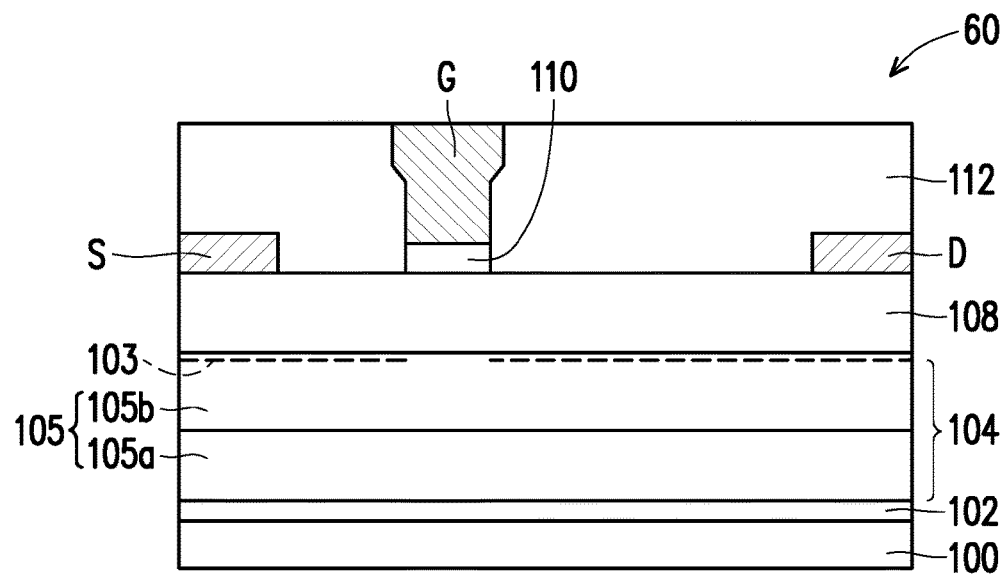
Figure 7:
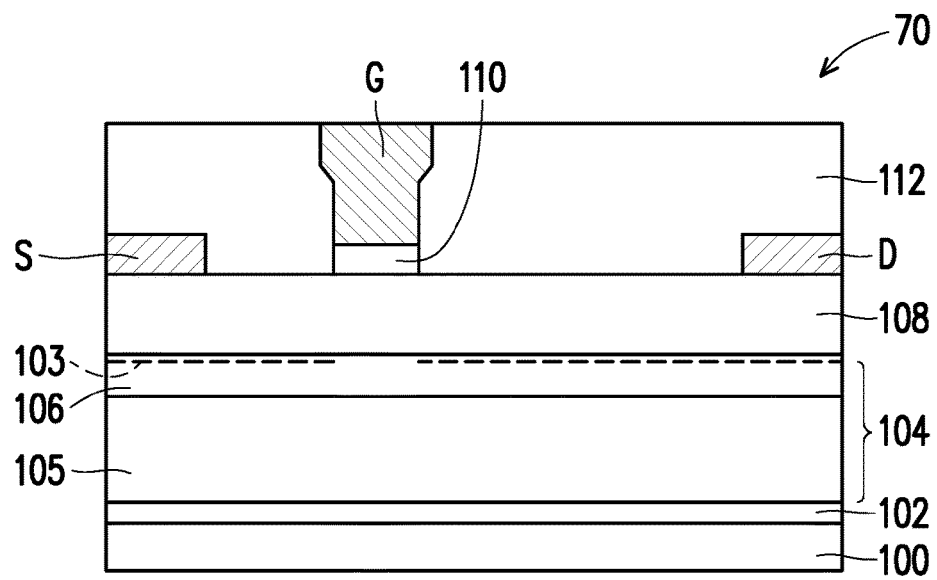
Figure 8:
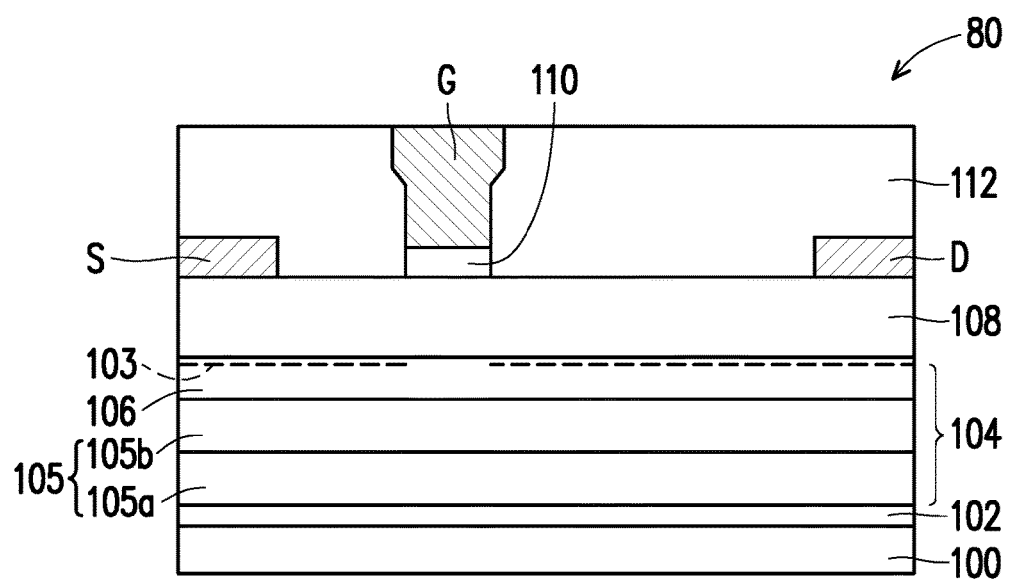

The semiconductor structure 40 of FIG. 4 is similar to the semiconductor structure 20 of FIG. 2, and the difference between them lies in that, the first semiconductor layer 104 of FIG. 4 further contains a group III-V semiconductor compound layer 106 over the group III-V-VI semiconductor compound layer 105. Specifically, the semiconductor layer 104 of FIG. 4 includes, from bottom to top, a lower group III-V-VI semiconductor compound layer 105a, an upper group III-V-VI semiconductor compound layer 105b and a group III-V semiconductor compound layer 106.

The above embodiments in which the semiconductor structures 10 to 40 are normally-on HEMT devices are provided for illustration purposes, and are not construed as limiting the present invention. In alternative embodiments, the semiconductor structures are designed to be normally-off HEMT devices as needed, as shown in FIG. 5 to FIG. 8.

The semiconductor structures 50 to 80 of FIG. 5 to FIG. 8 are similar to the semiconductor structures 10 to 40 of FIG. 1 to FIG. 4, and the difference between them lies in that, a P-type semiconductor layer 110 is further provided between the gate electrode G and the second semiconductor layer 108. The P-type semiconductor layer 110 is configured to form a cut-off region of the 2DEG layer 103 with a relatively low electron density. In an embodiment, the P-type semiconductor layer 110 includes a group III nitride, such as a group III-V semiconductor compound material. In an embodiment, the P-type semiconductor layer 110 includes GaN, AlGaN, InN, AlInN, InGaN or AlInGaN, and is doped with a P-type dopant (such as Mg). In an embodiment, the P-type semiconductor layer 110 can be a P-type GaN layer or a P-type AlGaN layer.

Figure 9:
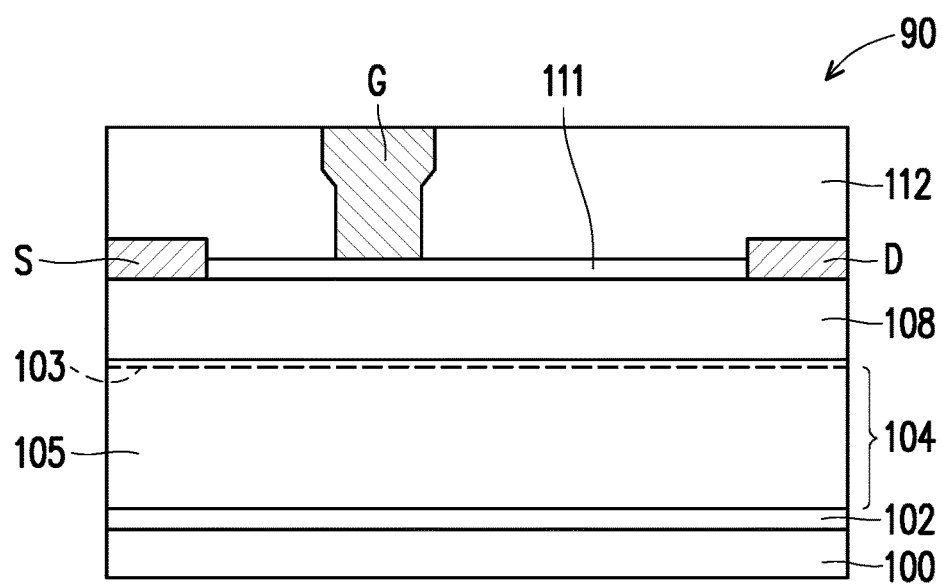

While the gate electrode G of the illustrative embodiments has a Schottky junction in which the gate electrode G is in contact with the underlying group III-V semiconductor compound (e.g., the second semiconductor layer 108), the gate electrode G may alternatively have a MIS (Metal-Insulator-Semiconductor) structure including a gate insulating layer 111 between the gate electrode G and the underlying group III-V semiconductor compound (e.g., the second semiconductor layer 108), as shown in the semiconductor device 90 of FIG. 9. People having ordinary skilled in the art should appreciate that the gate insulating layer can be applied to other semiconductor devices in FIGS. 2-8 as needed. For example, a gate insulating layer can be formed between the gate electrode G and the underlying group III-V semiconductor compound (e.g., P-type semiconductor layer 110).

The above embodiments are provided to illustrate the structures of the present invention, but the invention is not limited thereto. People having ordinary skilled in the art should appreciate that, the semiconductor structures are contemplated as falling within the spirit and scope of the present invention as long as the group III-V-VI semiconductor compound is used to reduce the lattice mismatch issue between adjacent layers. For example, the group III-V-VI semiconductor compound of the invention can be applied to a high power field-effect transistor device such as MOSFET as needed.

In summary, in the present invention, a group III-V-VI semiconductor compound material is provided between a group V substrate and a group III-V semiconductor compound, so as to reduce lattice dislocation resulting from lattice mismatch between the group V substrate and the group III-V semiconductor compound, and therefore improve the performance of the device.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A semiconductor structure, comprising:
 a substrate;
 a first semiconductor layer, containing a group III-V-VI semiconductor compound layer and disposed on the substrate;
 a second semiconductor layer, comprising a group III-V semiconductor compound and disposed on the first semiconductor layer;
 a gate electrode, disposed on the second semiconductor layer; and
 a source electrode and a drain electrode, disposed on the second semiconductor layer beside the gate electrode.

2. The semiconductor structure of claim 1, wherein the first semiconductor layer comprises GaNO, AlGaNO, AlNO, GaNS, GaNOS or a combination thereof.

3. The semiconductor structure of claim 1, wherein a group VI element content in the group III-V-VI semiconductor compound layer of the first semiconductor layer is substantially constant.

4. The semiconductor structure of claim 1, wherein a group VI element content in the group III-V-VI semiconductor compound layer of the first semiconductor layer is varied.

5. The semiconductor structure of claim 4, wherein an oxide content in a lower portion of the first semiconductor layer is higher than an oxide content in an upper portion of the first semiconductor layer.

6. The semiconductor structure of claim 1, wherein the first semiconductor layer further contains a group III-V semiconductor compound layer over the group III-V-VI semiconductor compound layer.

7. The semiconductor structure of claim 6, wherein the group III-V semiconductor compound layer of the first semiconductor layer comprises GaN.

8. The semiconductor structure of claim 1, further comprising a nucleation layer between the substrate and the first semiconductor layer.

9. The semiconductor structure of claim 8, wherein the nucleation layer contains a group III-V semiconductor compound.

10. The semiconductor structure of claim 9, wherein the nucleation layer comprises GaN, AlN, AlGaN, AlInN, InGaN, InAlGaN or a combination thereof.

11. The semiconductor structure of claim 8, wherein the nucleation layer contains a group III-V-VI semiconductor compound.

12. The semiconductor structure of claim 11, wherein the nucleation layer comprises GaNO, AlGaNO, AlNO, GaNS, GaNOS or a combination thereof.

13. The semiconductor structure of claim 1, wherein the second semiconductor layer comprises AlN, AlGaN, AlInN, InAlGaN or a combination thereof.

14. The semiconductor structure of claim 1, wherein the substrate comprises silicon, SiC, SiGe or a combination thereof.

15. The semiconductor structure of claim 1, wherein the semiconductor structure is a normally-on HEMT device.

16. The semiconductor structure of claim 1, wherein the semiconductor structure is a normally-off HEMT device.

17. The semiconductor structure of claim 1, wherein the first semiconductor layer has a substantially planar top surface.

18. The semiconductor structure of claim 1, wherein the gate electrode is not overlapped with the source electrode or the drain electrode.

* * * * *